United States Patent

Tallman et al.

[11] Patent Number: 5,949,495
[45] Date of Patent: Sep. 7, 1999

[54] DIGITAL CURSORS FOR SERIAL DIGITAL TELEVISION WAVEFORM MONITORS

[75] Inventors: James L. Tallman, Beaverton; Kenneth M. Ainsworth, Aloha; Bob Elkind, Gaston, all of Oreg.

[73] Assignee: Tektronix, Inc., Wilsonville, Oreg.

[21] Appl. No.: 08/639,293

[22] Filed: Apr. 25, 1996

[51] Int. Cl.[6] .................................................. H04N 9/76
[52] U.S. Cl. ...................... 348/601; 348/185; 348/177; 345/134; 345/157
[58] Field of Search .................................. 348/180, 181, 348/182, 183, 185, 177, 178, 601; 345/134, 157, 173, 145; H04N 9/76

[56] References Cited

U.S. PATENT DOCUMENTS

| | | | |
|---|---|---|---|
| 4,766,425 | 8/1988 | Tallman | 340/712 |
| 5,039,937 | 8/1991 | Mandt | 324/121 |
| 5,075,618 | 12/1991 | Katayama | 324/77 |
| 5,247,287 | 9/1993 | Jonker | 345/134 |
| 5,250,935 | 10/1993 | Jonker | 345/134 |
| 5,742,275 | 4/1998 | Ozawa | 345/134 |

OTHER PUBLICATIONS

"The Measurement of Digital Television Signals" Viewtronics Ltd. 1991.

*Primary Examiner*—John K. Peng
*Assistant Examiner*—Wesner Sajous
*Attorney, Agent, or Firm*—Francis I. Gray

[57] ABSTRACT

Generation of digital cursors for serial digital television waveform monitors includes inputting hexadecimal values for the cursors by an operator via a front panel. The hexadecimal values are received by a microprocessor which loads them into appropriate registers of a co-processor. The outputs of the cursor registers in the co-processor are input to respective inputs of a multiplexer together with a digital signal representing a serial digital television signal. A select signal for the multiplexer is generated by a selection circuit that is enabled by a digital cursor ON command when the waveform monitor is in a cursor mode. The selection circuit at predetermined locations of the digital signal generates the select signal so that the appropriate cursor values are inserted into the digital signal at those locations. The processed digital signal from the co-processor is then converted to analog, filtered, and displayed on a display device to present a waveform representing the serial digital television signal together with the digital cursors.

6 Claims, 2 Drawing Sheets

DIGITAL CURSORS FOR SERIAL DIGITAL TELEVISION WAVEFORM MONITORS

BACKGROUND OF THE INVENTION

The present invention relates to the display of serial digital television signals, and more particularly to digital cursors for serial digital television waveform monitors.

Television signals are now being transported as a serial digital signal in accordance with CCIR 601. Current technology uses a scrambled NRZI signal to represent the serial digital signal. The actual values are difficult to determine in this form due to the scrambling. When two pieces of equipment are interconnected and do not function properly, it is necessary to determine if the transmission is correct. Viewtronics Ltd of the United Kingdom has developed a DIGIVIEW measuring system for digital television signals for use with personal computers. A serial input card converts the serial digital signal to a parallel digital signal in accordance with CCIR 656. A DIGIVIEW expansion card accepts the parallel digital signal and displays it in either tabular or graphic form on the computer screen. Another approach is to use a dedicated television signal measurement instrument, such as the WFM601 Serial Component Monitor manufactured by Tektronix, Inc. of Wilsonville, Oreg., United States of America, to display serial digital signals. The serial digital signal is converted to a parallel digital signal, descrambled (or descrambled and then converted) and separated into individual component signals, Y, Pb, Pr. The individual component signals are converted into analog signals and appropriately filtered. The resulting analog signals may then be conventionally displayed on a suitable display device, such as a cathode ray tube, liquid crystal display, or the like. Such a waveform monitor is disclosed in U.S. Pat. No. 5,311,295 issued May 10, 1994 to James L. Tallman et al entitled "RGB Display of a Transcoded Serial Digital Signal", incorporated herein by reference.

To perform measurements on the displayed analog waveform the waveform monitors provide cursors to readout time and voltage values. These may be in the form of variable analog voltage values that are added to the analog waveform. Such cursors are disclosed in U.S. Pat. No. 5,047,709 issued Sep. 10, 1991 to Davorin Fundak entitled "Calibrated Voltage Cursors", incorporated herein by reference. The voltage level of the cursor may be converted to a digital value for display, either in terms of voltage or time.

What is desired is to provide an analogous digital cursor that is inserted into the serial digital signal to provide a direct readout of the cursor values while maintaining accuracy between the cursor and the serial digital signal.

SUMMARY OF THE INVENTION

Accordingly the present invention provides digital cursors for serial digital television waveform monitors by inserting a digital value into selected lines of a serial digital signal. The serial digital signal is descrambled and converted to a parallel digital signal. The parallel digital signal is input to a co-processor where digital cursors are added to the parallel digital signal. A microprocessor receives input from a front panel for a cursor value. The cursor value is loaded by the microprocessor into a register in the co-processor. The cursor value from the register is input to a multiplexer together with the parallel digital signal. When a digital cursor mode is selected, the microprocessor provides a digital cursor ON signal to the co-processor together with a line select signal. The digital cursor ON signal and the line select signal are combined in the co-processor to produce a select signal for the multiplexer. When the line select signal is present together with the digital cursor ON signal, then the select signal causes the multiplexer to pass the digital cursor value in lieu of the parallel digital signal to an output. The resulting combined parallel digital signal is then processed conventionally by a digital to analog converter with appropriate filters to provide a waveform display on a display device. The waveform display includes the cursors. The microprocessor also provides alphanumeric values for display via a readout display circuit. The alphanumeric values and the waveform are input to a switch which selects one or the other for display on the display device at a rate so that the two appear to be displayed simultaneously.

The objects, advantages and other novel features of the present invention are apparent from the following detailed description when read in conjunction with the appended claims and attached drawing.

BRIEF DESCRIPTION OF THE DRAWINGS

FIG. 3 is a block diagram view of a co-processor within the serial digital television waveform monitor for providing digital cursors according to the present invention.

DESCRIPTION OF THE PREFERRED EMBODIMENT

Figure 1:
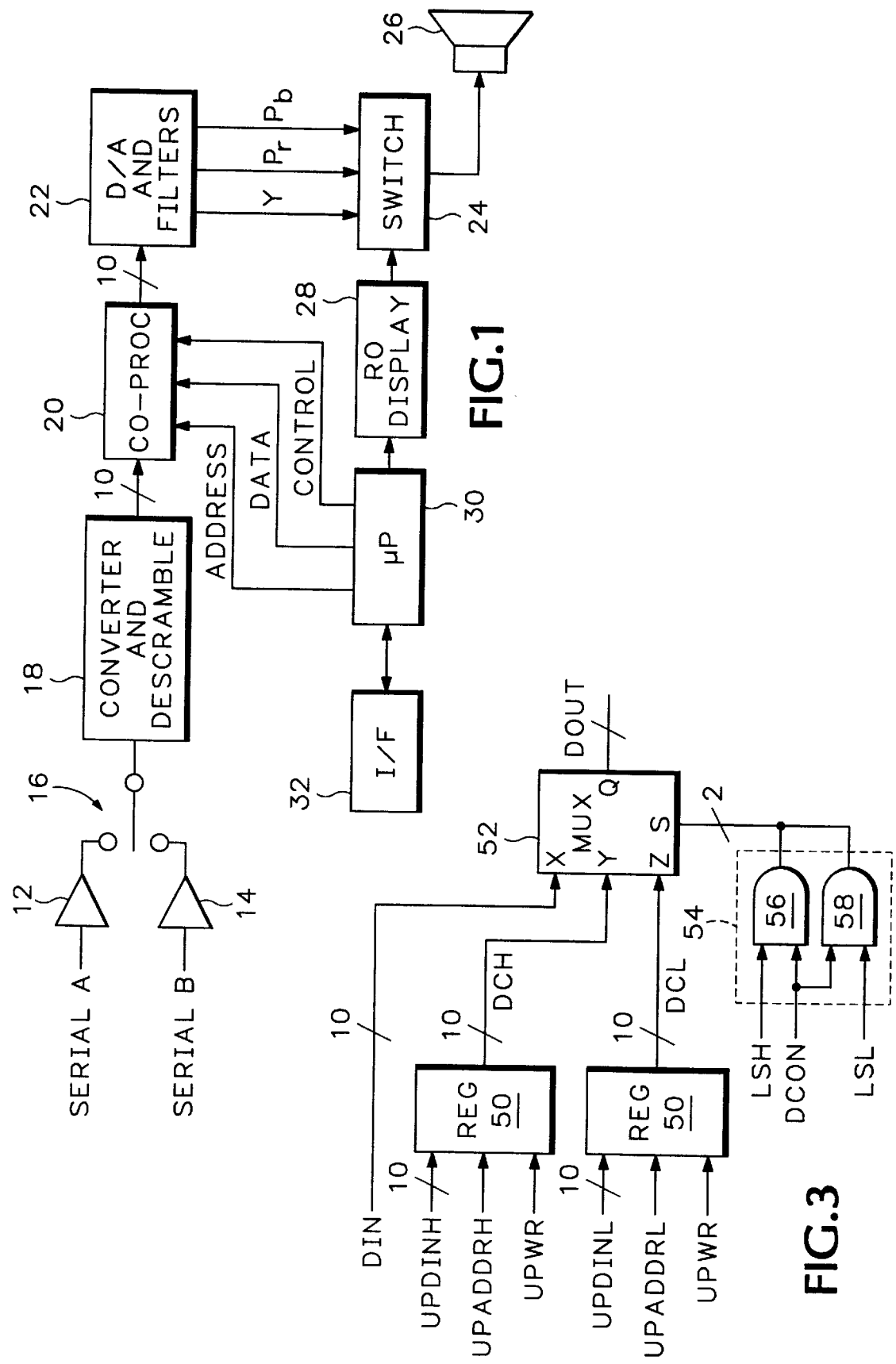
FIG. 1 is a block diagram of a serial digital television waveform monitor for displaying digital cursors according to the present invention.

Referring now to FIG. 1 a pair of serial digital signals, SERIAL_A and SERIAL_B, are input via respective buffers 12, 14 to an input select switch 16. The selected serial digital signal from the input select switch 16 is processed by a converter circuit 18. The converter circuit 18 descrambles the serial digital signal, if necessary, and converts the serial digital signal to a parallel digital signal. The parallel digital signal from the converter circuit 18 is input to a co-processor 20, the output from the co-processor being the parallel digital signal as modified by the co-processor. The parallel digital signal from the co-processor 20 is input to a digital to analog converter (DAC) and filtering circuit 22. The outputs from the DAC circuit 22 are analog component signals Y, Pb, Pr. These analog signals are input via a display switch 24 to a display device 26, such as a cathode ray tube (CRT), liquid crystal display, or the like. Also input to the display switch 24 are alphanumeric readouts from a readout display circuit 28. The readout display circuit 28 is loaded with values from a microprocessor 30 with which an operator interfaces via a front panel 32. The microprocessor 30 also provides commands, data and addresses to the co-processor 20.

Figure 2:
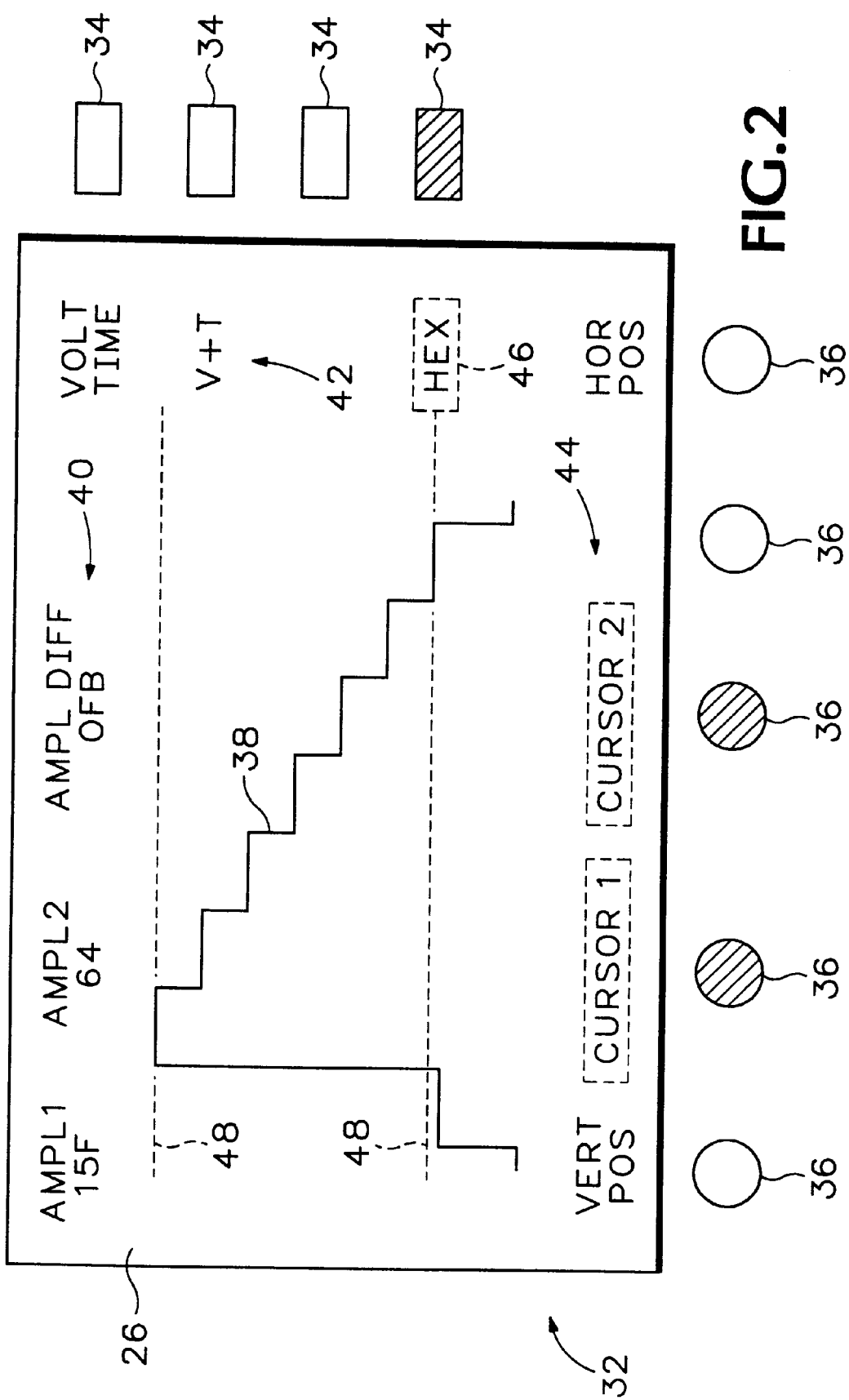
FIG. 2 is a plan view of a display for the serial digital television waveform monitor according to the present invention.

The front panel 32, as shown in FIG. 2, includes the display device 26 and some peripheral buttons 34 and knobs 36. Other input functions are not shown for the sake of clarity, but typically include buttons that are used to select magnification, lines, fields, etc., as is well known to those skilled in the art. A waveform 38 is shown on the display device 26, together with alphanumeric information in various fields about the edges of the display device. For example at the top of the display device may be a measurement field 40 which shows the results of various measurements, at the right side may be a menu field 42 which associates selections with adjacent buttons 34, and at the bottom may be a function field 44 which describes the function of the adjacent knobs 36. The display presented in FIG. 2 is one for the cursor mode where previous menu selections have been made to arrive at this mode. To select the digital cursor mode the button 34 adjacent the HEX label on the display device 26 is pushed. A dotted line 46 surrounds the label to indicate that it is selected. The knobs 36 now control the cursors CURSOR_1 and CURSOR_2, as indicated. If a touch sensitive screen is used as part of the display device 26, the menu selections may be made by touching the screen rather than by pressing the adjacent buttons 34. The values for the cursors are shown in the measurement field 42 under the appropriate label. As an operator turns one of the knobs 36 associated with one of the cursors, the cursor indication 48 on the screen moves up or down relative to the waveform 38 according to the direction in which the knob is turned.

The knob information is input to the microprocessor 40 as a change in value. The change in value is sampled by the microprocessor and added/subtracted from the current value to produce a new current value, which is provided to the readout display circuit for display on the display device 26. The new current value is input by the microprocessor 30 to the co-processor 20, and more particularly as shown in FIG. 3 to a register 50, where it is stored. The stored value from the register 50 is applied to a multiplexer 52 as one input. For two cursors there are two registers 50, and each register provides an input to the multiplexer 52. Also input to the multiplexer 52 is the parallel digital signal. A select signal for the multiplexer 52 is generated by a select circuit 54. Input to the select circuit 54 is a digital cursor on DCON command from the microprocessor 30 which is asserted when the digital cursor function is selected by the appropriate button 34. Also input to the select circuit 54 is a line select signal LSH, LSL for each cursor. The location, which may be a line, several lines, a portion of a line or combinations thereof, at which the cursor is input according to the line select signal may be fixed, such as in the vertical interval, or may be generated randomly for each field of the television signal during the active video. The select circuit 54 may be in the form of a pair of AND gates 56, 58, each having DCON as an enable signal, and having the respective line select signal as a control signal input. When DCON is on, then when the appropriate line select signal occurs, the multiplexer 52 selects the cursor value according to which line select signal it is. When DCON is off or no line select signal is present, then the multiplexer 52 selects the parallel digital signal. In this way a digital cursor is generated as part of the parallel digital signal so that it is affected by the same processes that affect the parallel digital signal, i.e., uses the same analog circuitry as the parallel digital signal representing the waveform.

For example to set up a piece of equipment the serial digital signal from the equipment may be input to the serial digital television waveform monitor, and the operator then sets a lower cursor to a value in hexadecimal for black as specified by the appropriate standard, such as the CCIR 601 reference. That hexadecimal value is loaded into the appropriate register 50 and appears during the line indicated by the appropriate line select signal LSL as part of the parallel digital signal that is displayed as a waveform 38 on the display device 26. The hexadecimal value is also displayed on the display device 26 either in the measurement field 40 or above the cursor function label in the function field 44. The operator then adjusts an upper cursor to a value in hexadecimal for white. With these cursors being displayed, the operator can then adjust the equipment by observing the resulting waveform 38 and its relationship to the cursors 48.

Thus the present invention provides digital cursors for serial digital television waveform monitors by inserting digital values for cursors into a digital television signal at selected lines.

What is claimed is:

1. A digital cursor generation circuit for a serial digital television waveform monitor comprises:

means for storing a digital cursor value input by an operator;

a multiplexer having a first input coupled to the digital cursor value from the storing means and a second input coupled to receive a digital signal representing a serial digital television signal for display on a display device of the serial digital television waveform monitor, having a select input coupled to receive a select signal, and having an output coupled to the display device; and means for generating the select signal for the multiplexer from a digital cursor ON command and a predetermined location of the serial digital television signal, the select signal causing the multiplexer to insert the digital cursor value into the digital signal at the predetermined location.

2. The digital cursor generation circuit as recited in claim 1 wherein the storing means comprises:

a register having the digital cursor value as an input, the register holding the digital cursor value on an output coupled to the first input of the multiplexer;

means for inputting the digital cursor value by the operator; and means for transferring the digital cursor value from the inputting means to the register input for storing in the register.

3. The digital cursor generation circuit as recited in claim 1 wherein the generating means comprises an AND gate enabled by the digital cursor ON command at a first input and having the predetermined location coupled to a second input, the AND gate providing the select signal at an output coupled to the select input of the multiplexer when the digital cursor ON command and the predetermined location are present at the inputs simultaneously to insert the digital cursor value at the predetermined location of the digital signal.

4. A method of generating digital cursors for a serial digital television waveform monitor comprising the steps of:

storing a digital cursor value input by an operator into a register;

selecting between the digital cursor value from the register and a digital signal representing a serial digital television signal for display on a display device of the serial digital television waveform monitor using a multiplexer having a first input coupled to receive the digital cursor value and a second input coupled to receive the digital signal, having a select input coupled to receive a select signal, and having an output coupled to the display device; and generating the select signal for the selecting step from a digital cursor ON command and a predetermined location of the serial digital television signal, the select signal causing the selecting step to insert the digital cursor value into the digital signal at the predetermined location.

5. The method as recited in claim 4 wherein the storing step comprises the steps of:

applying the digital cursor value to an input terminal; and transferring the digital cursor value from the input terminal into the register for storing, the register holding the digital cursor value on an output for input to the selecting step.

6. The method as recited in claim 4 wherein the generating step comprises the steps of, enabling an AND gate with the cursor ON command;

applying the predetermined location as an input to the AND gate; and providing the select signal as an output from the AND gate when the digital cursor ON command and the predetermined location are present simultaneously to insert the digital cursor value at the predetermined location of the digital signal.

* * * * *